(12) United States Patent
Onishi et al.

(10) Patent No.: US 9,679,989 B2
(45) Date of Patent: Jun. 13, 2017

(54) INSULATED GATE TYPE SWITCHING DEVICE AND METHOD FOR MANUFACTURING THE SAME

(71) Applicant: TOYOTA JIDOSHA KABUSHIKI KAISHA, Toyota-shi, Aichi-ken (JP)

(72) Inventors: Toru Onishi, Nagoya (JP); Atsushi Onogi, Toyota (JP); Tadashi Misumi, Nisshin (JP); Yusuke Yamashita, Nagakute (JP); Yuichi Takeuchi, Obu (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/235,726

(22) Filed: Aug. 12, 2016

(65) Prior Publication Data

US 2017/0092742 A1    Mar. 30, 2017

(30) Foreign Application Priority Data

Sep. 24, 2015  (JP) .................................. 2015-186613

(51) Int. Cl.
| | |
|---|---|
| *H01L 29/66* | (2006.01) |
| *H01L 29/10* | (2006.01) |
| *H01L 29/739* | (2006.01) |
| *H01L 29/78* | (2006.01) |

(52) U.S. Cl.
CPC .... *H01L 29/66734* (2013.01); *H01L 29/1095* (2013.01); *H01L 29/66348* (2013.01); *H01L 29/7397* (2013.01); *H01L 29/7813* (2013.01)

(58) Field of Classification Search
CPC ......... H01L 29/66734; H01L 29/66348; H01L 29/7397; H01L 29/1095; H01L 29/7813
See application file for complete search history.

(56) References Cited

U.S. PATENT DOCUMENTS

2015/0171175 A1 *  6/2015  Takaya ................ H01L 29/7813
257/330

FOREIGN PATENT DOCUMENTS

JP         2015-118966 A       6/2015

* cited by examiner

*Primary Examiner* — Selim Ahmed
(74) *Attorney, Agent, or Firm* — Oliff PLC

(57) ABSTRACT

A method of manufacturing an insulated gate type switching device includes forming a gate trench that has a first portion with a first width in a first direction and a second portion with a second width in the first direction, the second width being wider than the first width. In an oblique implantation, second conductivity type impurities are irradiated at an irradiation angle inclined around an axis orthogonal to the first direction. The first width, the second width, and the irradiation angle are set such that the second conductivity type impurities are suppressed, at a first side surface of the first portion, from being implanted into a part below a lower end of a second semiconductor region, and at a second side surface of the second portion, the impurities are implanted into the part below the lower end of the second semiconductor region.

3 Claims, 10 Drawing Sheets

INSULATED GATE TYPE SWITCHING DEVICE AND METHOD FOR MANUFACTURING THE SAME

CROSS-REFERENCE TO RELATED APPLICATION

This application claims priority to Japanese Patent Application No. 2015-186613 filed on Sep. 24, 2015, the entire contents of which are hereby incorporated by reference into the present application.

TECHNICAL FIELD

The present application relates to an insulated gate type switching device and a method. for manufacturing the same. Note that, the insulated gate type switching device herein refers to a switching device including a gate electrode insulated from a semiconductor substrate. As examples of the insulated gate type switching device, there are given a MOSFET and an IGBT.

DESCRIPTION OF RELATED ART

A MOSFET disclosed in Japanese Patent Application Publication No. 2015-118966 includes a laminated structure including an n-type drift region, a p-type body region, and an n-type source region. In a surface of a semiconductor substrate, gate trenches penetrating the source region and the body region so as to reach the drift region is disposed. The gate trench extends linearly in the surface of the semiconductor substrate. In a range exposed on a bottom surface of each gate trench, a p-type bottom region is disposed. In each gate trench, a gate electrode insulated from the semiconductor substrate by a gate insulating layer is arranged. In a range exposed on side surfaces located at ends in a longitudinal direction of the gate trench (hereinafter, referred to as a longitudinal side surface), a p-type connection region for connecting the body region and the bottom region is arranged. At side surfaces located at ends in a short direction of the gate trench (hereinafter, referred to as a short directional side surface), the drift region exists between the body region and the bottom region, and the connection region is not arranged.

When a potential of the gate electrode is increased to a gate threshold or more, a channel is formed in the body region, and the MOSFET is turned on. When the potential of the gate electrode is reduced to less than the gate threshold, the channel in the body region disappears, and the MOSFET is turned off. When the MOSFET is turned off, a depletion layer extends from the body region into the drift region. Further, the bottom region and the body region are connected by the connection region, and hence a potential of the bottom region is substantially equal to a potential of the body region. Thus, when the MOSFET is turned off, a depletion layer extends also from the bottom region into the drill region. The bottom region promotes the extension of the depletion layer to around a bottom portion of each gate trench. Thus, in this MOSFET, an electric field around the bottom portion of the gate trench can be reduced.

SUMMARY

The connection regions in Japanese Patent Application Publication No. 2015-118966 are formed by implanting p-type impurities to the longitudinal side surfaces of the gate trenches. In this case, by irradiating the p-type impurities at an irradiation angle inclined around an axis parallel to the short direction of the gate trenches, the p-type impurities are implanted to the longitudinal side surfaces of the gate trenches. In this step, the semiconductor substrate is set so that an irradiation direction of the p-type impurities and the short directional side surfaces of the gate trenches are parallel. With this, the p-type impurities are suppressed from being implanted to the short directional side surfaces of the gate trenches. However, it is difficult to accurately set the semiconductor substrate so that the irradiation direction of the p-type impurities and the short directional side surfaces are parallel. In addition, the irradiation direction of the p-type impurities varies. For these reasons, the p-type impurities are implanted by a certain amount to entireties of the short directional side surfaces of the gate trenches. In the body region, when the p-type impurities are implanted to a range exposed on the short directional side surfaces of the gate trenches, a density of the p-type impurities increases in that. range As a result, the gate threshold (gate potential necessary for forming a channel in the body region) varies. Due to this, the technology of Japanese Patent Application Publication No. 2015-118966 has a problem in that the gate threshold widely varies at the time of mass-production of the MOSFETs. Thus, according to an embodiment of the present application, there is provided a technology of preventing variation in gate threshold of insulated gate type switching devices that include a connection region.

A method for manufacturing an insulated gate type switching device is disclosed herein. The method comprises forming a laminated structure, forming a gate trench, forming a bottom region, and oblique implanting impurities, and forming a gate electrode. In the forming of a laminated structure, a laminated structure: is formed in a semiconductor substrate, the laminated structure including a first semiconductor region of a first conductivity type, a body region of a second conductivity type located on at least a part of the first semiconductor region, and a second semiconductor region of the first conductivity type located on at least a part of the body region. In the forming of a gate trench, a gate trench is formed, the gate trench including a first portion and a second portion, the first portion having a first width along a first direction in a planar view of a surface of the semiconductor substrate, the second portion having a second width along the first direction in the planar view of the surface, the second width being wider than the first width, the first portion penetrating the second semiconductor region and the body region from the surface so as to reach the first semiconductor region, and the second portion penetrating the body region from the surface to reach the first semiconductor region. In the forming of a bottom region, a bottom region of the second conductivity type is formed in a range exposed on a bottom surface of the gate trench. In the oblique implanting of impurities, second conductivity type impurities are implanted to a first side surface and a second side surface by irradiating the second conductivity type impurities, the first side surface being a side surface defining an end of the first portion in the first direction, the second side surface being a side surface defining an end of the second portion in the first direction. The irradiation is performed at an irradiation angle inclined with respect to a normal line of the surface around an axis orthogonal to the first direction on the surface. The first width, the second width, and the irradiation angle are set so that the second conductivity type impurities are suppressed from being implanted to a depth range located below a lower end of the second semiconductor region at the first side surface, and the second conductivity type impurities are implanted to the depth range located below the lower end of the second semiconductor region at the second side surface. In the oblique implanting of impurities, a connection region of the second conductivity type which connects the body region and the bottom region is formed by the implantation of the second conductivity type impurities to the second side surface. In the forming of a gate trench, a gate electrode insulated from the semiconductor substrate by a gate insulating layer is formed in the gate trench.

Note that, one of the first conductivity type and the second conductivity type described above corresponds to an n-type, and the other corresponds to a p-type.

Further, the second portion may only have to penetrate at least the body region. When the second portion is formed at a portion where the second semiconductor region exists on the body region, the second portion may penetrate the second semiconductor region and the body region.

Still further, in the forming of the laminated structure, not all of the first semiconductor region, the body region, and the second semiconductor region may not have to be formed. For example, the laminated structure may be formed by preparing a semiconductor substrate of the first conductivity type which corresponds to the first semiconductor region, and forming the body region and the second semiconductor region in the semiconductor substrate. Yet further, another step may be carried out in the middle of the forming of the laminated structure. For example, the forming of a gate trench may be carried out after the body region is formed on the first semiconductor region, and the second semiconductor region may be formed, for example, by implanting impurities after the forming of the gate trench. Further, the forming of the gate trench may be carried out before the forming of the laminated structure. When the forming of the gate trench is carried out in the middle of the forming of the laminated structure or before the forming of the laminated structure, the structure in which "the first portion penetrating the second semiconductor region and the body region from the surface so as to reach the first semiconductor region" is obtained by the time the forming of the laminated structure is completed. Further, the forming of the bottom region and the oblique implanting may be carried out at any timing so long as the timing is after the forming of the gate trench and before the forming of the gate electrode. Further, an order of carrying out the forming of the laminated structure, the forming of the bottom region, and the oblique implanting may be changed as appropriate, There is no particular problem as long as the structure of the connection region "connecting the body region and the bottom region" is obtained after all of the forming of the laminated structure, the forming of the bottom region, and the oblique implanting are completed. Note that, When the oblique implanting is carried out before the second semiconductor region is formed, the second semiconductor region has not yet been formed at the time the oblique implanting is carried out. In this case, "the position of the lower end of the second semiconductor region" in the oblique implanting means a position of a lower end of the second semiconductor region to be formed after the oblique implanting, Further, the forming of the gate electrode may be carried out at any timing as long as the timing is after the forming of the bottom region and the oblique implanting. The forming of the gate electrode may be carried out before the forming of the laminated structure.

Now, with reference to FIG. 16, detailed description is made of the above-described manufacturing method, Note that, FIG. 16 shows merely an example for describing the oblique implanting, and hence the manufacturing method disclosed herein is not limited to the structure of FIG. 16. Specifically, with respect to a first semiconductor region 161, a body region 163, a second semiconductor region 162, and a bottom region 164 shown in FIG. 16, the oblique implanting may he carried out before formation of those regions.

In this manufacturing method, the gate trench includes the first portion narrow in the first direction and the second portion wide in the first direction. In the oblique implanting of the second conductivity type impurities, the second conductivity type impurities are implanted at the irradiation angle inclined around the axis orthogonal to the first direction, Thus, the second conductivity type impurities are implanted to the first side surface defining an end of the first portion in the first direction, and the second side surface defining an end of the second portion in the first direction. In the example in FIG. 16, a gate trench includes a first portion 110 narrow in a first direction 150 and a second portion 120 wide in the first direction 150. When the second conductivity type impurities are irradiated at an irradiation angle denoted by the reference numeral 130, the second conductivity type impurities are implanted to a first side surface 112 defining an end of the first portion 110 in the first direction 150, and a second side surface 122 defining an end of the second portion 120 in the first direction 150. In the implanting of the second conductivity type impurities, a depth range of the side surfaces into which the second conductivity type impurities are implanted varies depending on the width of the gate trench in the first direction.

In the narrow first portion, the second conductivity type impurities are suppressed from being implanted to a deep range in the first side surface (specifically, depth range located below the lower end of the second semiconductor region). Thus, according to the manufacturing method, a second conductivity type impurity density in the body region can be suppressed from being increased in a range exposed on the first side surface. Due to this, variation in gate threshold of insulated gate type switching device can be suppressed. In the example in FIG. 16, a deep range at the first side surface 112 is shaded by a semiconductor layer 140 or the like on an opposite side to the first side surface 112 in the first direction 150, and hence the second conductivity type impurities are suppressed from being implanted to the deep range at the first side surface 112. Thus, the second conductivity type impurities are suppressed from being implanted to a depth range located below a lower end position 162a of the second semiconductor region 162 at the first side surface 112. In other words, the second conductivity type impurities are suppressed from being implanted to a depth range corresponding to the body region 163. Also with this, variation in gate threshold of insulated gate type switching device can be suppressed.

On the other hand, in the wide second portion, the second conductivity type impurities are implanted to a deep range at the second side surface (specifically, depth range located below the lower end of the second semiconductor region). Due to this, a connection region of the second conductivity type that connects the body region and the bottom region can be formed. In the example in FIG. 16, the second conductivity type impurities are implanted to a deep range at the second side surface 122 of the second portion 120 (range in vicinity of a bottom surface of the trench). Thus, the second conductivity type impurities are implanted to the depth range located below the lower end position 162a of the second semiconductor region 162 at the second side surface 122. With this, in a range exposed on the second side surface 122, a second connection region 165 of the second conductivity type that connects the body region 163 and the bottom region 164 can be formed. Since the second connection region 165 connects the body region 163 and the bottom region 164, electric field can be suppressed from concentrating in vicinity of the gate trench.

According to the manufacturing method, as described above, an insulated gate type switching device comprising a connection region can be manufactured, and variation in gate threshold can be suppressed at the time of mass-production of switching devices.

Further, according to another aspect of the present application, a novel insulated gate type switching device is provided. This insulated gate type switching device comprises: a first semiconductor region; a body region; a second semiconductor region; a gate trench; a bottom region; a connection region; and a gate electrode. The first semiconductor region is a region of a first conductivity type. The body region is a region of a second conductivity type located on at least a part of the first semiconductor region. The second semiconductor region is a region of the first conductivity type located on at least a part of the body region. The gate trench includes a first portion and a second portion, the first portion having a first width along a first direction in a planar view of a surface of a semiconductor substrate, the second portion having a second width along the first direction in the planar view of the surface, the second width being wider than the first width. The first portion penetrates the second semiconductor region and the body region from the surface to reach the first semiconductor region. The second portion penetrates the body region from the surface to reach the first semiconductor region. The bottom region is a region of the second conductivity type located in a range exposed on a bottom surface of the gate trench. The connection region is a region of the second conductivity type located in a range exposed on a side surface defining an end portion of the second portion in the first direction and connecting the body region and the bottom region. The gate electrode is located in the gate trench and insulated from the semiconductor substrate by a gate insulating layer. A second conductivity type impurity density in the body region in a range exposed on a side surface defining an end portion of the first portion in the first direction is lower than a second conductivity type impurity density in the body region above the connection region and in the range exposed on the side surface defining the end of the second portion in the first direction.

According to the insulated gate type switching device, the connection region connects the bottom region and the body region. With this, electric field can be suppressed from concentrating in the vicinity of the gate trench. Further, according to this structure, the second conductivity type impurity density in the body region in the range exposed on the side surface of the first portion is low. Thus, the density is less liable to vary, and hence a gate threshold is stabilized.

DETAILED DESCRIPTION

Figure 2:
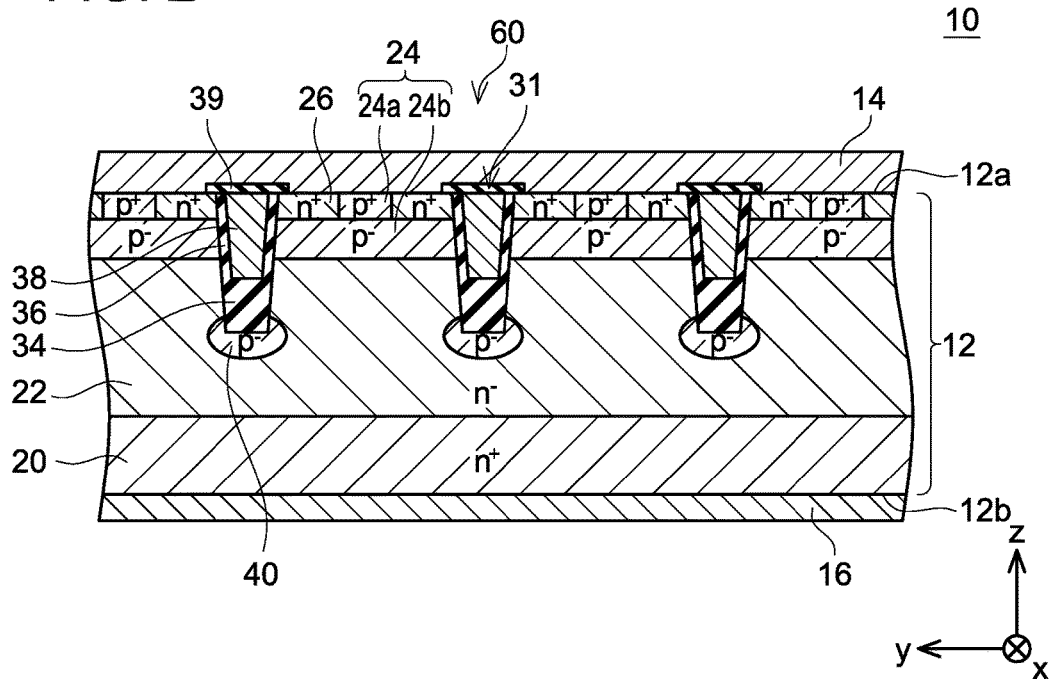
FIG. 2 is a vertical sectional view taken along line II-II in FIG. 1.
Figure 3:
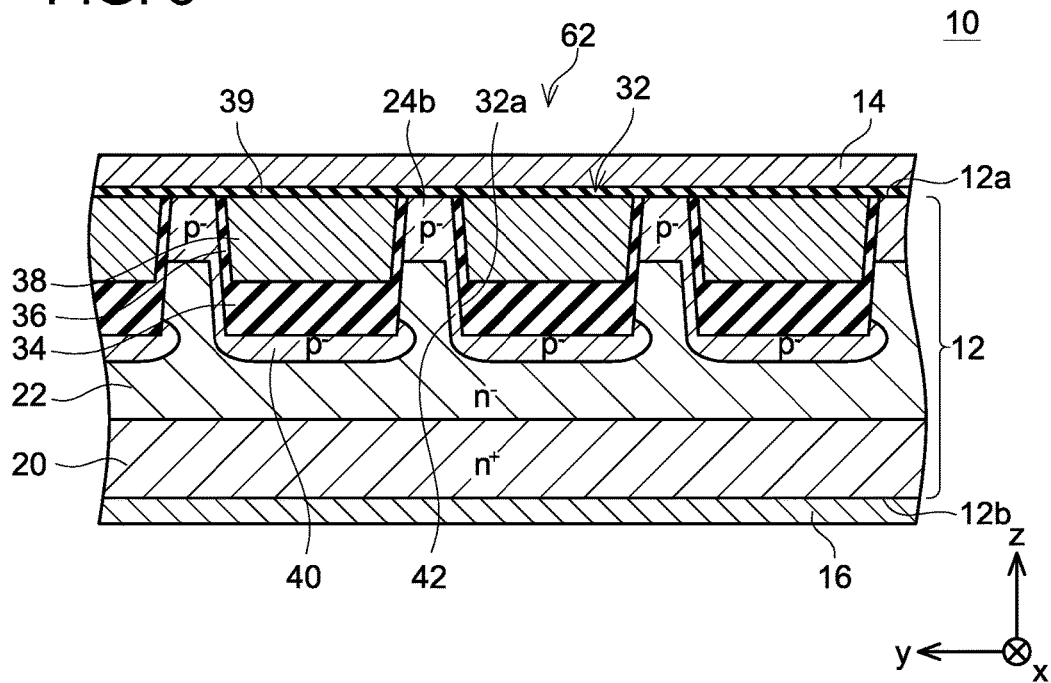
FIG. 3 is a vertical sectional view taken along line III-III in FIG. 1.

As shown in FIGS. 2 and 3, a MOSFET 10 according to an embodiment comprises a semiconductor substrate 12, an upper electrode 14, and a lower electrode 16. The semiconductor substrate 12 is made of SiC. The upper electrode 14 covers an upper surface 12a of the semiconductor substrate 12. The lower electrode 16 covers a lower surface 12b of the semiconductor substrate 12. Note that, herein, a thickness direction of the semiconductor substrate 12 is referred to as a z-direction, one direction orthogonal to the z-direction (one direction parallel to the upper surface 12a) is referred to as an x-direction, and a direction orthogonal to both the z-direction and the x-direction is referred to as a y-direction.

Figure 1:
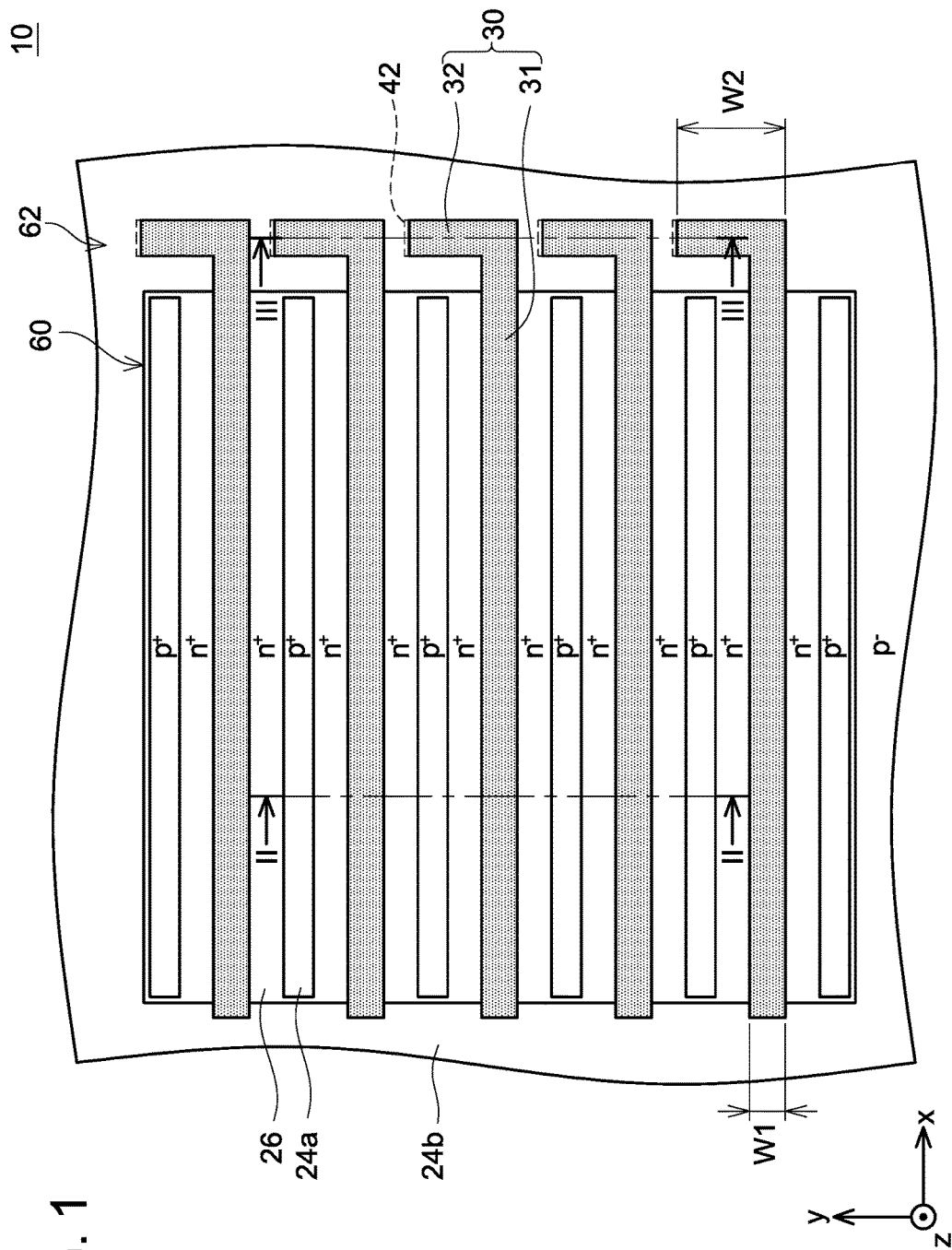
FIG. 1 is a plan view of a MOSFET 10 according to an embodiment of the present application (in which an upper electrode 14 and interlayer insulating films 39 are omitted)

As shown in FIG. 1, in the semiconductor substrate 12, source regions 26 and body contact regions 24a are located in a manner of being exposed on the upper surface 12a of the semiconductor substrate 12. In the following, a range where the source regions 26 and the body contact regions 24a exist in a planar view of the upper surface 12a of the semiconductor substrate 12 is referred to as a device range 60, and a range outside of the device range 60 in the same planar view is referred to as an outside range 62. In the device range 60, a structure of performing switching is disposed.

As shown in FIGS. 2 and 3, the semiconductor substrate 12 includes a drain layer 20, a drift layer 22, a body layer 24, and the above mentioned source regions 26.

As shown in FIGS. 2 and 3, the drain layer 20 is located across the device range 60 and the outside range 62. The drain layer 20 is an n-type region having a high density of n-type impurities. The drain layer 20 is exposed on an entirety of the lower surface 12b of the semiconductor substrate 12. The drain layer 20 is in contact with the lower electrode 16.

As shown in FIGS. 2 and 3, the drift layer 22 is located across the device range 60 and the outside range 62. The drift layer 22 is an n-type region lower in density of the n-type impurities than the drain layer 20. The drift layer 22 is located on the drain layer 20. The drift layer 22 is in contact with the drain layer 20.

As shown in FIGS. 2 and 3, the body layer 24 is located on the drift layer 22. The body layer 24 is a p-type region. The body layer 24 includes the plurality of body contact regions 24a and a low-density body layer 24b.

The low-density body layer 24b is a p-type region having a low density of p-type impurities. As shown in FIGS. 2 and 3, the low-density body layer 24b is located across the device range 60 and the outside range 62. The low-density body layer 24b is located on the drift layer 22, and in contact with the drift layer 22. As shown in FIGS. 1 and 3, in the outside range 62, the low-density body layer 24b is exposed on the upper surface 12a of the semiconductor substrate 12.

As shown in FIGS. 1 and 2, the body contact regions 24a are located above parts of the low-density body layer 24b in the device range 60. The body contact regions 24a are each a p-type region higher in density of the p-type impurities than the low-density body layer 24b. The body contact regions 24a are in contact with the low-density body layer 24b. The body contact regions 24a are exposed on the upper surface 12a of the semiconductor substrate 12. The body contact regions 24a are in contact with the upper electrode 14. As shown in FIG. 1, the body contact regions 24a are arranged in a stripe pattern elongated in the x-direction.

As shown in FIGS. 1 and 2, each source region 26 is located above a part of the low-density body layer 24b in the device range 60. The source regions 26 are an n-type region higher in density of the n-type impurities than the drift layer 22. The source regions 26 are located on the low-density body layer 24b at positions in the device range 60 where the body contact regions 24a do not exist (path position adjacent to the corresponding body contact region 24a). Each source region 26 is in contact with the low-density body layer 24b and the corresponding body contact region 24a. The source regions 26 are exposed on the upper surface 12a of the semiconductor substrate 12. The source regions 26 are in contact with the upper electrode 14. As shown in FIG. 1, the source regions 26 are arranged in a stripe pattern elongated in the x-direction along the body contact regions 24a.

As shown in FIG. 1, in the upper surface 12a of the semiconductor substrate 12, a plurality of gate trenches 30 is arranged. Note that, in FIG. 1, for better visibility, the gate trenches 30 are indicated by hatching. The gate trenches 30 each include a first portion 31 elongated in the x-direction in the upper surface 12a, and a second portion 32 elongated in the y-direction in the upper surface 12a. In other words, the gate trenches 30 each extend in an shape in the upper surface 12a. A most part of the first portion 31 is located in the device range 60, and both end portions of the first portion 31 protrude from the device range 60 into the outside range 62. The second portion 32 extends in the y-direction from one of the end portions of the first portion 31. An entirety of the second portion 32 is located in the outside range 62. When a width of each gate trench 30 is measured along the y-direction, a width W2 of the second portion 32 is wider than a width W1 of the first portion 31. As shown in FIGS. 2 and 3, the first portion 31 and the second portion 32 have a substantially same depth.

As shown in FIGS. 1 and 2, in the device range 60, each first portion 31 is located adjacently to the corresponding source regions 26 and apart from the body contact regions 24a. In the z-direction, the first portion 31 penetrates the source regions 26 and the low-density body layer 24b so as to reach the drift layer 22. Thus, in a range near a bottom of the first portion 31, the drift layer 22 is exposed on both side surfaces of the first portion 31. In a range above the drift layer 22, the low-density body layer 24b is exposed on both side surfaces of the first portion 31. In a range above the low-density body layer 24h, the corresponding source regions 26 are exposed on both the side surfaces of the first portion 31.

As shown in FIGS. 1 and 3, in the outside range 62, each second portion 32 is located at a position adjacent to the low-density body layer 24b. In the z-direction, the second portion 32 penetrates the low-density body layer 24b to reach the drift layer 22. Thus, in a range near the upper surface 12a, the low-density body layer 24b is exposed on both side surfaces of the second portion 32.

As shown in FIGS. 2 and 3, in each of the gate trenches 30 (specifically, in the first portion 31 and the second portion 32), a bottom insulating layer 34, a gate insulating film 36, and a gate electrode 38 are disposed. The bottom insulating layer 34 is a thick insulating layer located near a bottom of the gate trench 30. Above the bottom insulating layer 34, a side surface of the gate trench 30 is covered with the gate insulating film 36 (thin film of an insulator). In the device range 60, the source regions 26, the low-density body layer 24b, and the drift layer 22 are in contact with the gate insulating film 36. In the gate trench 30, the gate electrode 38 is located above the bottom insulating layer 34. The gate electrode 38 is insulated from the semiconductor substrate 12 by the bottom insulating layer 34 and the gate insulating film 36. Further, an upper surface of the gate electrode 38 is covered with the interlayer insulating film 39. The gate electrode 38 is insulated from the upper electrode 14 by the interlayer insulating film 39.

The semiconductor substrate 12 further includes a plurality of bottom regions 40, and a plurality of connection regions 42.

Each bottom region 40 is a p-type region. As shown in FIGS. 2 and 3, the bottom region 40 is disposed in a range exposed on a bottom surface of the corresponding gate trench 30. The bottom region 40 extends along the bottom surface of the gate trench 30. The bottom region 40 is exposed on an entirety of the bottom surface of the gate trench 30 (specifically, entirety of a bottom surface of the first portion 31 and entirety of a bottom surface of the second portion 32). The bottom regions 40 are separated from each other by the drift layer 22. Further, except ranges where the connection regions 42 are disposed, each bottom region 40 is separated from the low-density body layer 24b by the drift layer 22.

Each connection region 42 is a p-type region. As shown in FIGS. 1 and 3, the connection region 42 is disposed in a range exposed on a side surface 32a on one side of the second portion 32 of the corresponding gate trench 30 (side surface defining one end in the y-direction). The connection region 42 extends along the side surface 32a of the second portion 32. An upper end of the connection region 42 is connected to the low-density body layer 24b. A lower end of the connection region 42 is connected to the corresponding bottom region 40. The connection region 42 connects the low-density body layer 24b and the corresponding bottom region 40. On a side surface on another side of each of the second portions 32 (side surface opposite to the side surface 32a), no connection region 42 is formed and the drift layer 22 is exposed on a range near a bottom of the side surface on the other side.

Note that, the p-type impurity density in the low-density body layer 24b is higher in a range above each connection region 42 and where the low-density body layer 24b is exposed on the side surface 32a (that is, part near the side surface 32a in the low-density body layer 24b) than that of a part of the low-density body layer 24b near the side surface of the first portion 31. This is because, as described below, in an oblique implantation step of forming the connection regions 42, the p-type impurities are implanted to the entirety of the side surface 32a of each of the second portions 32.

Next, description is made of an operation of the MOSFET 10 in a case where a potential of the lower electrode 16 is higher than a potential of the upper electrode 14. When a potential equal to or higher than a gate threshold is applied to the gate electrodes 38, in the low-density body layer 24b, channel (inversion layer) is formed in a range near each gate insulating film 36. The channel connects the source regions 26 and the drift layer 22. With this, electrons flow from the upper electrode 14 via the source regions 26, the channel, the drift layer 22, and the drain layer 20 into the lower electrode 16. In other words, the MOSFET 10 is turned on, and current is allowed to flow therethrough. Note that, no source region 26 is formed in the outside range 62, and hence a main current does not flow in the outside range 62.

When the potential of the gate electrodes 38 is reduced to less than the gate threshold, the channel disappears, and the MOSFET 10 is turned off. Then, a reverse voltage is applied to a p-n junction at an interface between the low-density body layer 24b and the drift layer 22. With this, a depletion layer extends from the low-density body layer 24h into the drift layer 22. Further, each bottom region 40 is connected to the low-density body layer 24b by the corresponding connection region 42, and hence a potential of the bottom regions 40 is substantially equal to a potential of the low-density body layer 24b. Thus, the reverse voltage is applied also to a p-n junction at an interface between each of the bottom regions 40 and the drift layer 22. As a result, a depletion layer extends also from each of the bottom regions 40 into the drift layer 22. In this way, by the depletion layers extending from both the low-density body layer 24b and the bottom regions 40, a substantial entirety of the drift layer 22 is depleted. With this, a high voltage can be maintained in the MOSFET 10 in the OFF state. Further, when the depletion layer extends from each of the bottom regions 40 into the drift layer 22 as described above, the depletion layer rapidly extends around the bottom portion of each of the gate trenches 30. With this, a high electric field is suppressed from being generated near the bottom portions of the gate trenches 30. In this way, the MOSFET 10 has high voltage resistance.

As described above, in the MOSFET 10, the p-type impurity density in the low-density body layer 24b is low near the side surfaces of the first portions 31 of the gate trenches 30. Thus, channel is easily formed at those positions in the low-density body layer 24b, and hence the gate threshold of the MOSFET 10 is low. In addition, when the p-type impurity density in the low-density body layer 24b is low at those positions, the p-type impurity density therein is less liable to vary. Therefore, the gate threshold of the MOSFET 10 is also less liable to vary.

Figure 4:
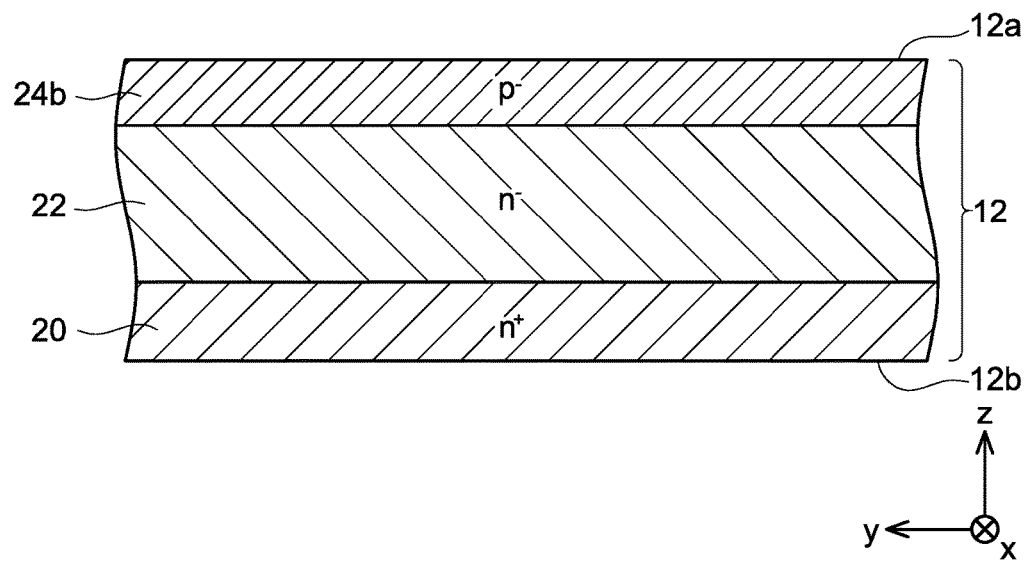
FIG. 4 is an explanatory view of a flow of manufacturing the MOSFET 10.

Next, description is made of a method for manufacturing the MOSFET 10. A SiC substrate (unprocessed semiconductor substrate 12) that is substantially equal to the drain layer 20 described above in n-type impurity density is prepared. First, as shown in FIG. 4, by epitaxial growth, the drift layer 22 is formed on the drain layer 20. Then, as shown in FIG. 4, by epitaxial growth, the low-density body layer 24b is formed on the drift layer 22.

Figure 5:
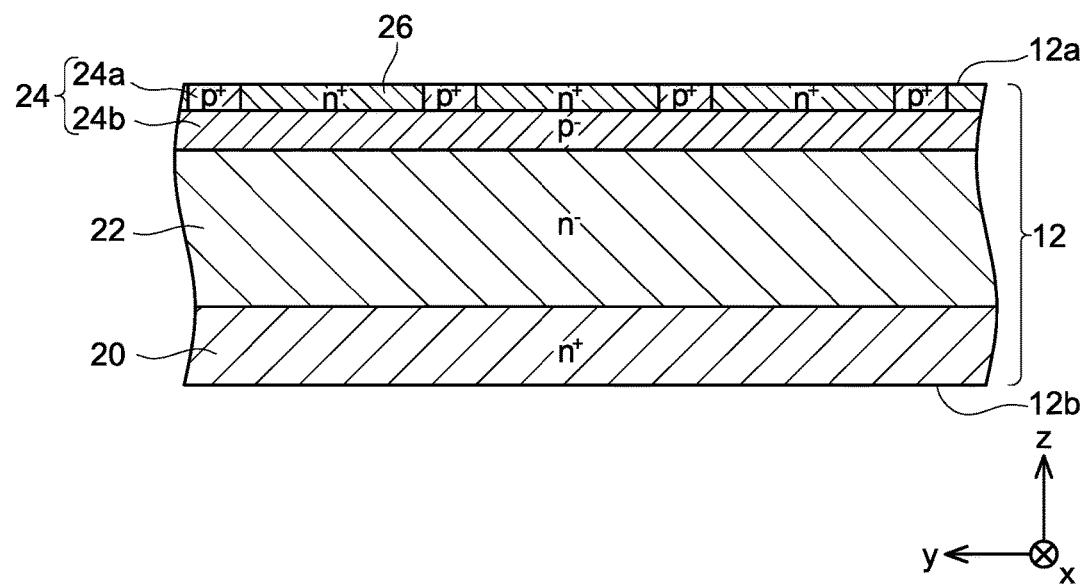
FIG. 5 is another explanatory view of the flow of manufacturing the MOSFET 10.

Next, as shown in FIG. 5, by ion implantation, the source regions 26 and the body contact regions 24a are formed to be arranged on the low-density body layer 24b. As shown in FIG. 1, the source regions 26 and the body contact regions 24a are formed in a partial range (device range 60) on the upper surface 12a of the semiconductor substrate 12. Thus, in the outside range 62, as shown in FIG. 4, the low-density body layer 24b remains exposed on the upper surface 12a.

Figure 6:
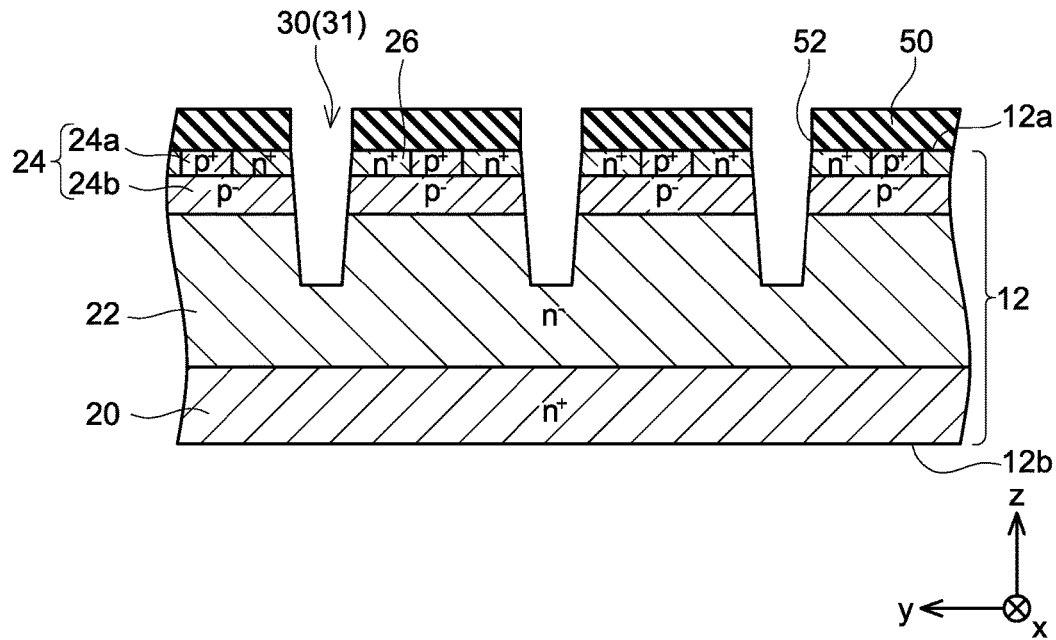
FIG. 6 is still another explanatory view of the flow of manufacturing the MOSFET 10 (vertical sectional view corresponding to FIG. 2)
Figure 7:
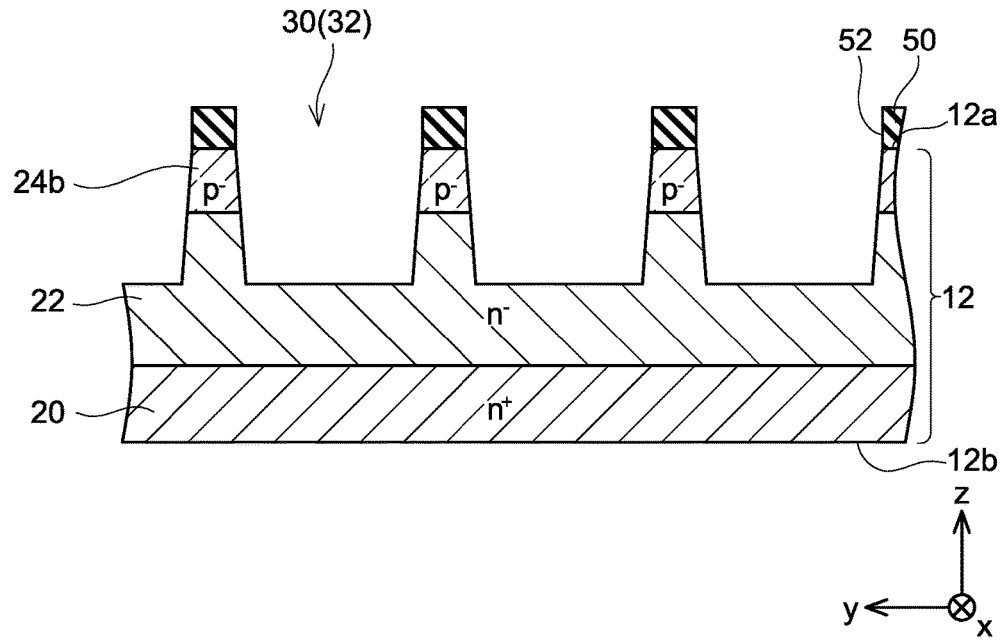
FIG. 7 is yet another explanatory view of the flow of manufacturing the MOSFET 10 (vertical sectional view corresponding to FIG. 3)

Then, as shown in FIGS. 6 and 7, a resist 50 is formed on the upper surface 12a of the semiconductor substrate 12, and openings 52 are formed through the resist 50. The openings 52 are formed in a range where the gate trenches 30 are to be formed. Next, the upper surface 12a of the semiconductor substrate 12 is etched via the resist 50 so that the gate trenches 30 are formed. Note that, instead of the resist 50, an oxide film provided with openings may be used as a mask.

Figure 8:
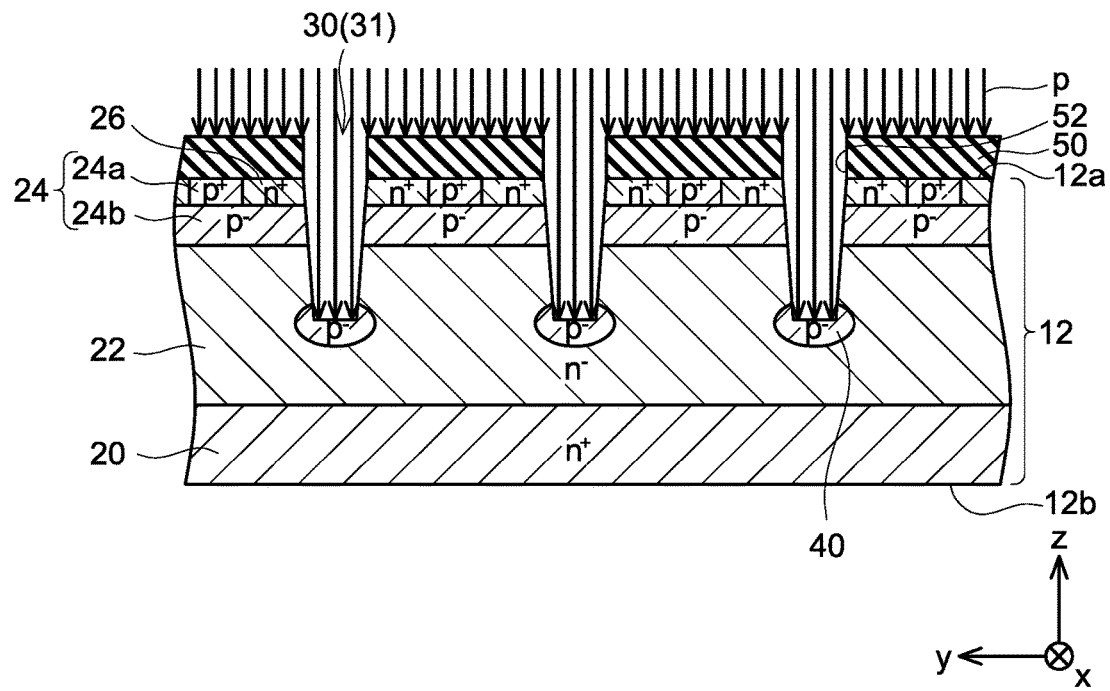
FIG. 8 is yet another explanatory view of the flow of manufacturing the MOSFET 10 (vertical sectional view corresponding to FIG. 2)
Figure 9:
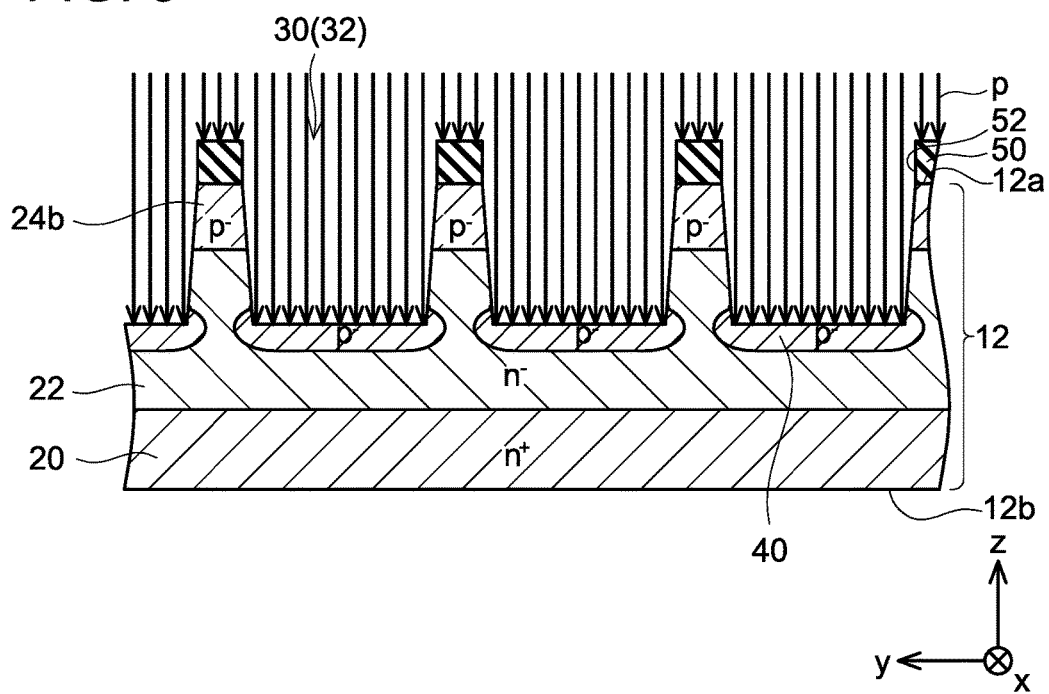
FIG. 9 is yet another explanatory view of the flow of manufacturing the MOSFET 10 (vertical sectional view corresponding to FIG. 3)

After that, as shown in FIGS. 8 and 9, the p-type impurities are irradiated toward the semiconductor substrate 12 via the resist 50. At this time, an irradiation angle is set so that the p-type impurities are irradiated in a direction perpendicular to the upper surface 12a. The resist 50 prevents the p-type impurities from being implanted to the upper surface 12a. The p-type impurities that passed through the openings 52 are implanted to the bottom surfaces of the gate trenches 30. Due to this, the bottom regions 40 are formed in the ranges exposed on the bottom surfaces of the gate trenches 30. Note that, a thin oxide film may be formed over the side and bottom surfaces of the gate trenches 30 in advance, and the p-type impurities may be implanted to the bottom surfaces through the oxide film. By the oxide film formed in this way, the p-type impurities can be suppressed from being implanted to the side surfaces of the gate trenches 30.

Figure 10:
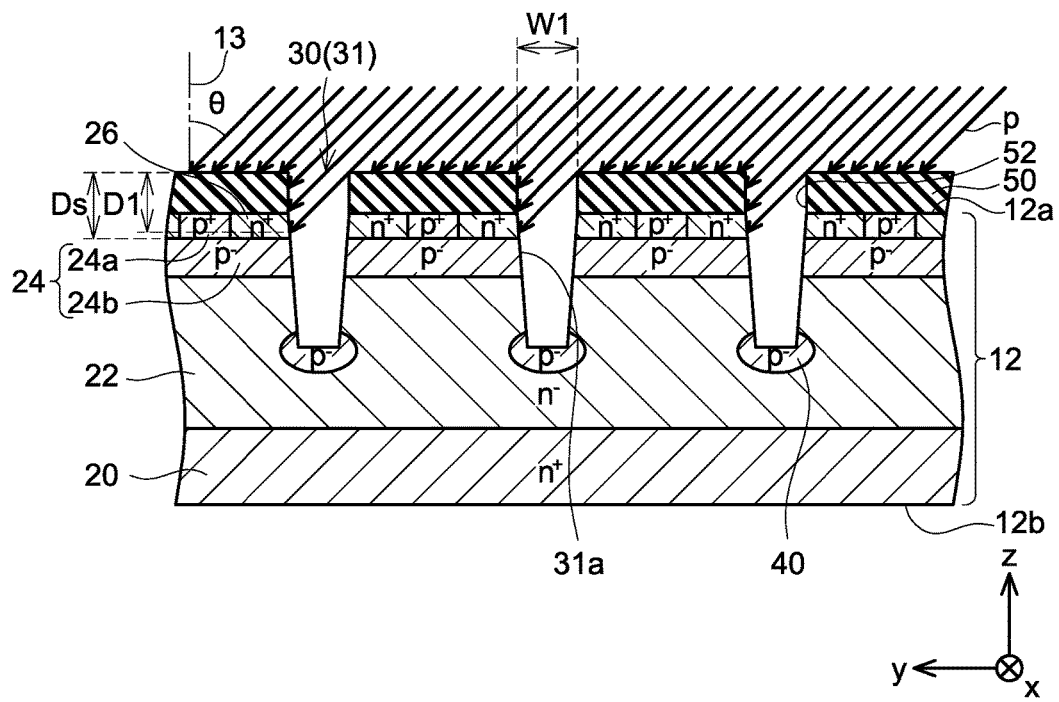
FIG. 10 is yet another explanatory view of the flow of manufacturing the MOSFET 10 (vertical sectional view corresponding to FIG. 2)
Figure 11:
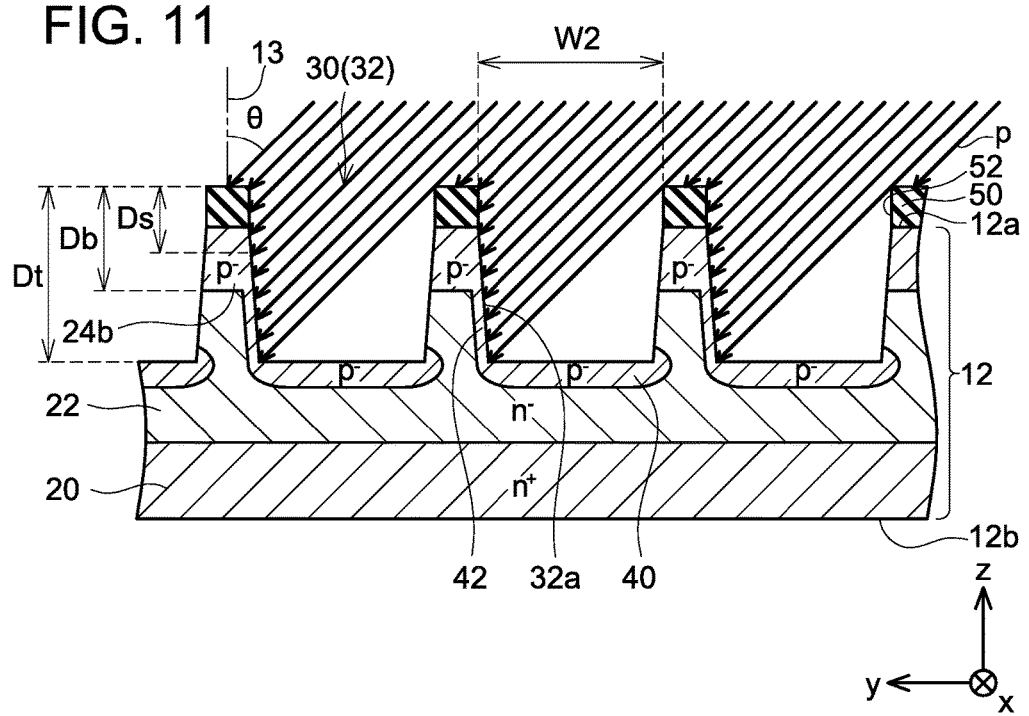
FIG. 11 is yet another explanatory view of the flow of manufacturing the MOSFET 10 (vertical sectional view corresponding to FIG. 3)

Next, as shown in FIGS. 10 and 11, via the resist 50, the p-type impurities are irradiated obliquely onto the semiconductor substrate 12 (oblique implantation step). At this time, the irradiation angle is set so that the p-type impurities are irradiated in a direction inclined with respect to a normal line 13 of the upper surface 12a around an axis parallel to the x-direction (that is, inclination angle θ is formed between the normal line 13 and the irradiation direction), The resist 50 prevents the p-type impurities from being implanted to the upper surface 12a. Further, the p-type impurities that passed through the openings 52 are implanted to a side surface 31a and the side surface 32a on the one side that define an end of each gate trench 30 in the y-direction. Specifically, as shown in FIG. 10, in each first portion 31, the p-type impurities are implanted to the side surface 31a. on the one side in the y-direction. Further, as shown in FIG. 11, in each second portion 32, the p-type impurities are implanted to the side surface 32a on the one side in the y-direction. At this time, depth ranges at the side surfaces 31a and 32a where the p-type impurities are implanted vary depending on the widths of the gate trenches 30 in the y-direction.

The width W1 of each first portion 31 in the y-direction is narrower than the width W2 of each second portion 32 in the y-direction. Thus, since a deep range at the side surface 31a is shaded by the resist 50 and the semiconductor layers on the opposite side with respect to the side surface 31a, the p-type impurities are suppressed from being implanted to this deep range. Thus, in the first portion 31, the p-type impurities are implanted to a shallow range at the side surface 31a. In the first portion 31, the width W1 is set so that a distance D1 (D1=W1/tanθ) satisfies a relationship Ds>D1. As shown in FIG. 10, the distance D1 is substantially equal to a distance in the z-direction from an upper surface of the resist 50 to a position of a lower end of the depth range at the side surface 31a where the p-type impurities are implanted. As shown in FIG. 10, a distance Ds refers to a distance in the z-direction from the upper surface of the resist 50 to a position of lower ends of the source regions 26. When the relationship Ds>D1 is satisfied, at the side surfaces 31a, the p-type impurities are suppressed from being implanted to a depth range located below the lower ends of the source regions 26. In other words, at the. side surface 31a, the p-type impurities are suppressed from being implanted to a depth range where the low-density body layer 24b is exposed.

Since the width W2 of each second portion 32 in the y-direction is wider than the width W1 of each first portion 31 in the y-direction, the depth range at the side surface 32a where the p-type impurities are implanted is wide. In the second portion 32, the width W2 is set so that a distance D2 (D2=W2/tanθ) satisfies a relationship Ds<D2. The distance D2 is substantially equal to a distance in the z-direction from the upper surface of the resist 50 to a position of a lower end of the depth range at the side surface 32a where the p-type impurities are implanted. When the relationship Ds<D2 is satisfied, at the side surfaces 32a, the p-type impurities are implanted to the depth range located below the lower ends of the source regions 26. Further, a distance Db in FIG. 11 refers to a distance in the z-direction from the upper surface of the resist 50 to a lower end of the body layer 24 in a range at the side surface 32a Where the body layer 24 is exposed. In the second portion 32, the width W2 is set so that a relationship Db<D2 is satisfied. Thus, at the side surface 32a of the second portion 32, the p-type impurities are implanted to a depth range located below a lower end of the low-density body layer 24b (that is, depth range where the drift layer 22 is exposed). Due to this, the drift layer 22 is transformed into a p-type layer in the range exposed on the side surface 32a, and the connection regions 42 of the p-type are formed. Each connection region 42 connects the low-density body layer 24b and the corresponding bottom region 40. Note that, in the second portion 32, it is preferred that the above-mentioned distance D2 be set larger than a distance Dt in the z-direction (refer to FIG. 11) from the upper surface of the resist 50 to the bottom surfaces of the gate trenches 30. When the distance D2 is set in this way, the p-type impurities can be implanted to an entirety of the side surface 32a in a depth direction. With this, the connection regions 42 are each easily connected to the corresponding bottom region 40.

As described above, in the oblique implantation step, the inclination angle θ, the width W1, and the width W2 are set so that both the relationships Ds>D1 and Ds<D2 are satisfied. Due to this, the p-type impurities can be suppressed from being implanted to the low-density body layer 24b in the first portions 31, and at the same time, the connection regions 42 can be formed in the second portions 32.

Next, heat treatment is performed on the semiconductor substrate 12 so that the impurities implanted to the semiconductor substrate 12 are activated.

After that, as shown in FIGS. 2 and 3, the bottom insulating layer 34, the gate insulating film 36, and the gate electrode 38 are formed in each of the gate trenches 30. Then, the interlayer insulating film 39 is formed, and the upper electrode 14 is formed thereon to cover the interlayer insulating film 39. Next, the lower electrode 16 is formed on the lower surface 12b of the semiconductor substrate 12. By the steps described above, the MOSFET 10 shown in FIGS. 1 to 3 is completed.

According to the oblique implantation step described above in this embodiment, at the side surface 31a of the first portion 31 of each of the gate trenches 30, the p-type impurities can be suppressed from being implanted to the depth range corresponding to the low-density body layer 24b. Since the low-density body layer 24b near the side surface 31a is a region where channel is formed, when the p-type impurities are implanted to this region in the low-density body layer 24b, the gate threshold of the MOSFET 10 is increased. According to the manufacturing method of this embodiment, the p-type impurities can be suppressed from being implanted to this region in the low-density body layer 24b, and hence the gate threshold can be suppressed from being increased. Thus, according to this method, the gate threshold of the MOSFET 10 can be suppressed from varying. Further, the density of the p-type impurities in this region in the low-density body layer 24b influences an ON resistance of the MOSFET. Thus, according to the oblique implantation step described above, the ON resistance can also be suppressed from varying. In addition, according to this manufacturing method, without adding steps to the conventional manufacturing methods, the p-type impurities can be suppressed from being implanted to the low-density body layer 24b near the side surface 31a. Thus, according to this method, the MOSFET 10 can be efficiently manufactured.

Note that, in the manufacturing method of this embodiment, as shown in FIG. 10, in the oblique implantation step, in a depth range corresponding to the source regions 26, the p-type impurities are implanted to the side surfaces 31a of the first portions 31. However, even when the p-type impurities are implanted to the source regions 26, there is little influence on characteristics of the MOSFET 10.

Further in the manufacturing method of this embodiment, as shown in FIG. 11, in the oblique implantation step, in the depth range corresponding to the low-density body layer 24b, the p-type impurities are implanted to the side surfaces 32a on the second portions 32. However, since the low-density body layer 24b above the connection regions 42 does not constitute a current path, even when the p-type impurities are implanted to this region in the low-density body layer 24b, there is little influence on the characteristics of the MOSFET 10.

Figure 12:
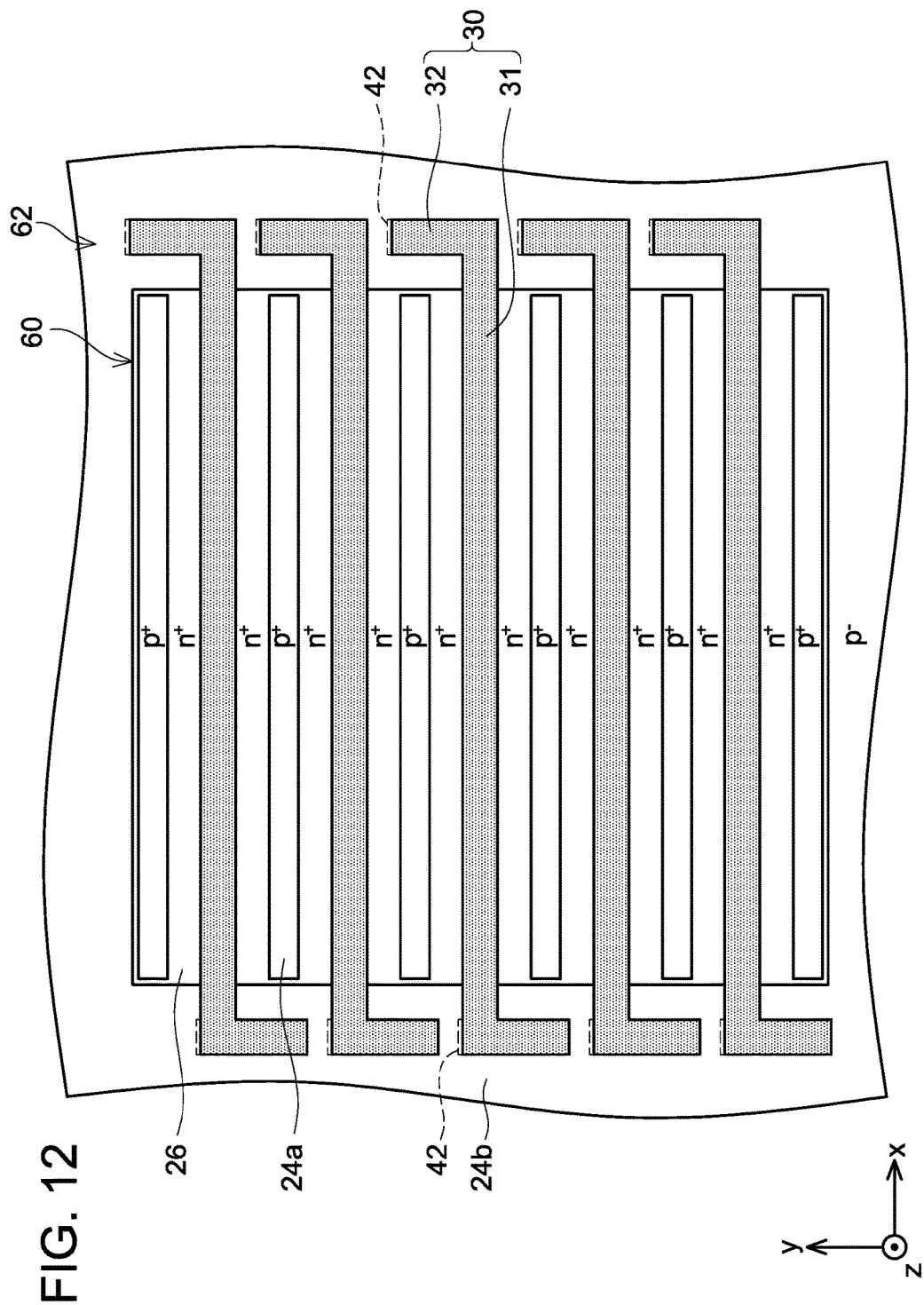
FIG. 12 is a plan view of a MOSFET according to a modification.

Note that, as shown in FIG. 12, the second portions 32 may be provided at both of the end portions of each first portion 31 in the x-direction.

Figure 13:
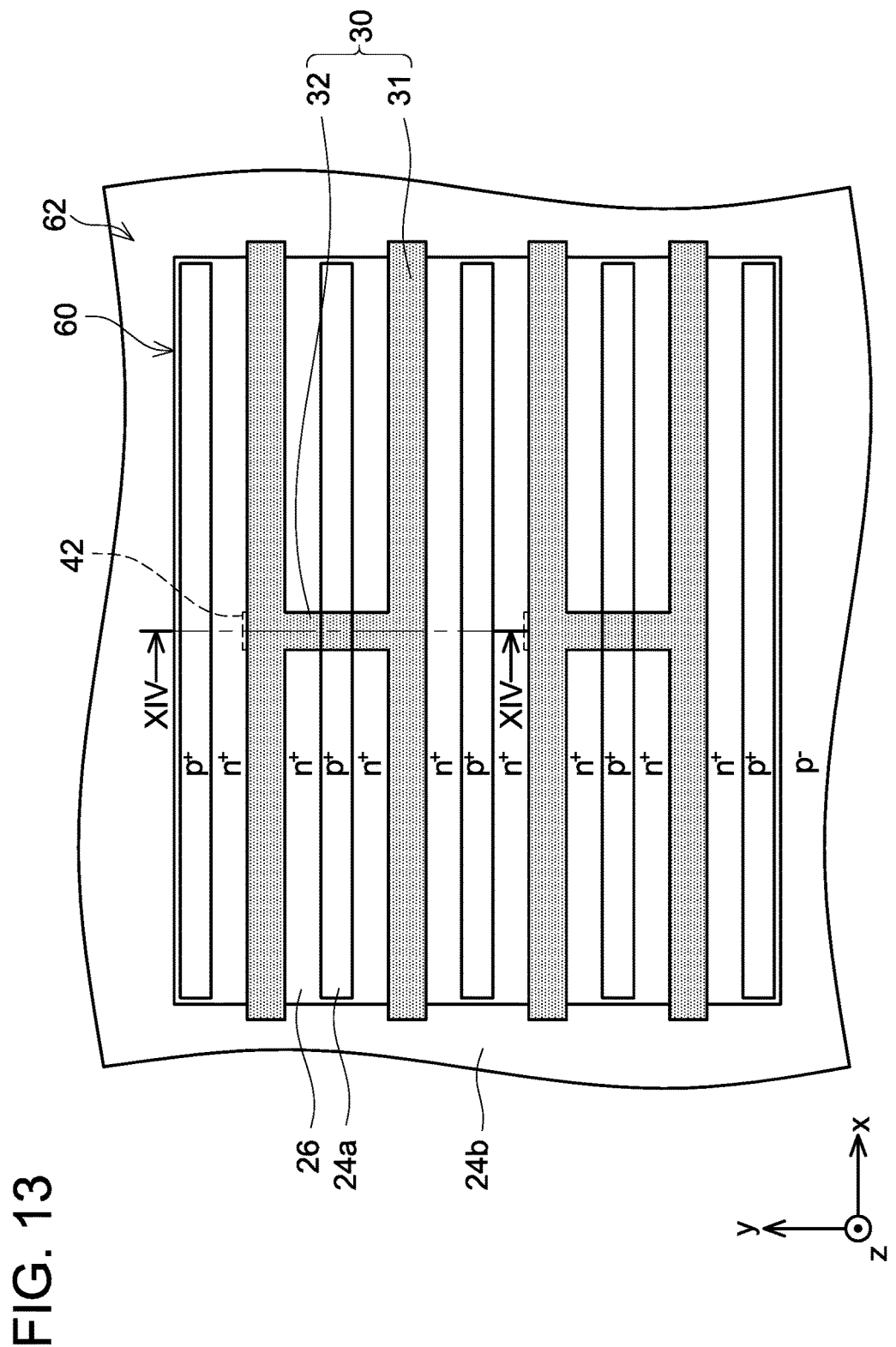
FIG. 13 is a plan view of a MOSFET according to another modification.
Figure 14:
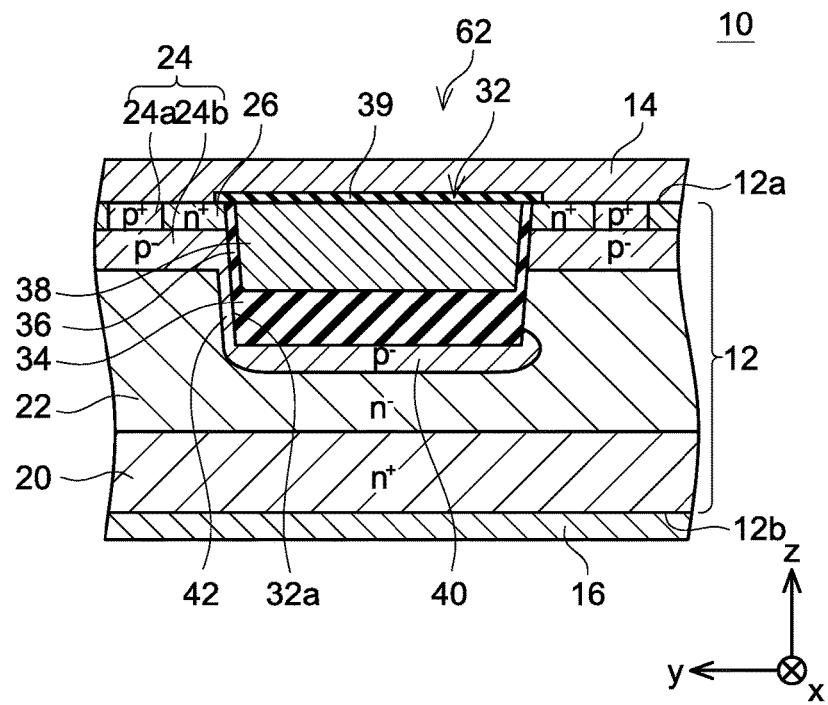
FIG. 14 is a vertical sectional view taken along line XIV-XIV in FIG. 13.

Further, as shown in FIG. 13, the second portion 32 may be provided so that two first portions 31 are connected. In addition, as shown in FIG. 13, even when the connection regions 42 are provided in the device range 60, there is no particular problem. In this case, as shown in FIG. 14, the second portion 32 of each gate trench 30 is formed in a manner of penetrating the source region 26 and the low-density body layer 24b. The connection region 42 is formed along the side surface 32a of the second portion 32 on the one side in the y-direction. The connection region 42 is formed below the source region 26. Also when the connection region 42 is formed below the source region 26 in this way, the low-density body layer 24b and the bottom region 40 can be connected. Note that, when the connection region 42 is formed below the source region 26 as shown in FIG. 13, a number of current paths in the device range 60 is reduced. Therefore, it is more preferred that the connection region 42 be formed in a range where no source region 26 is located (for example, outside range 62).

Figure 15:
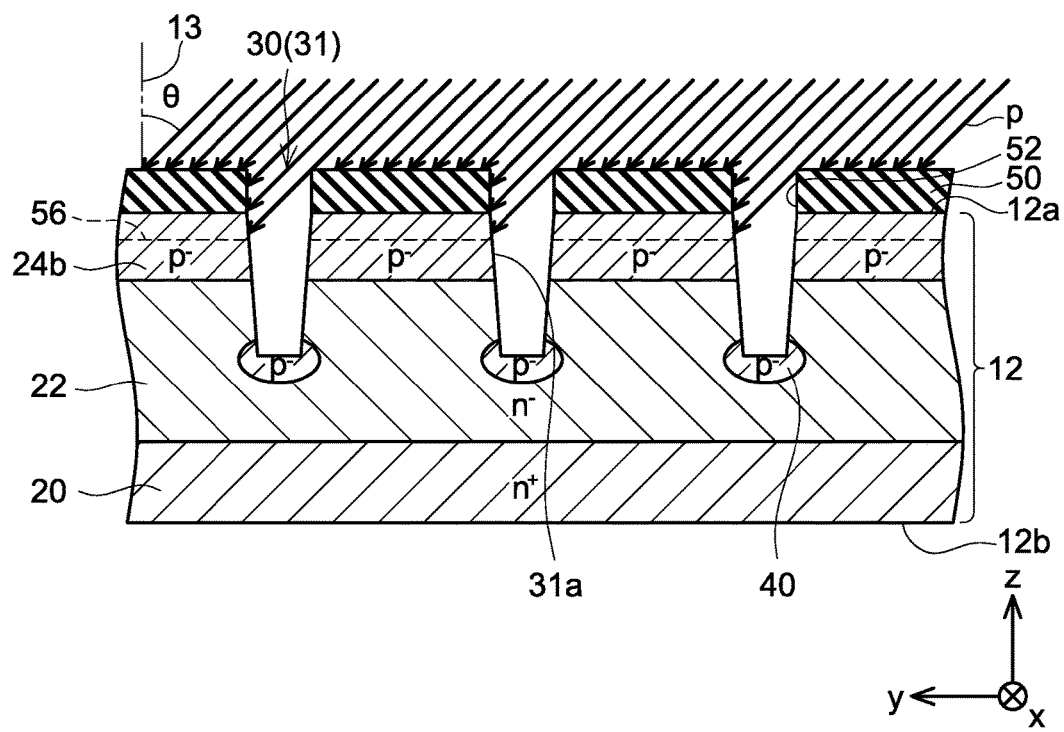
FIG. 15 is an explanatory view of a manufacturing method according to still another modification.
Figure 16:
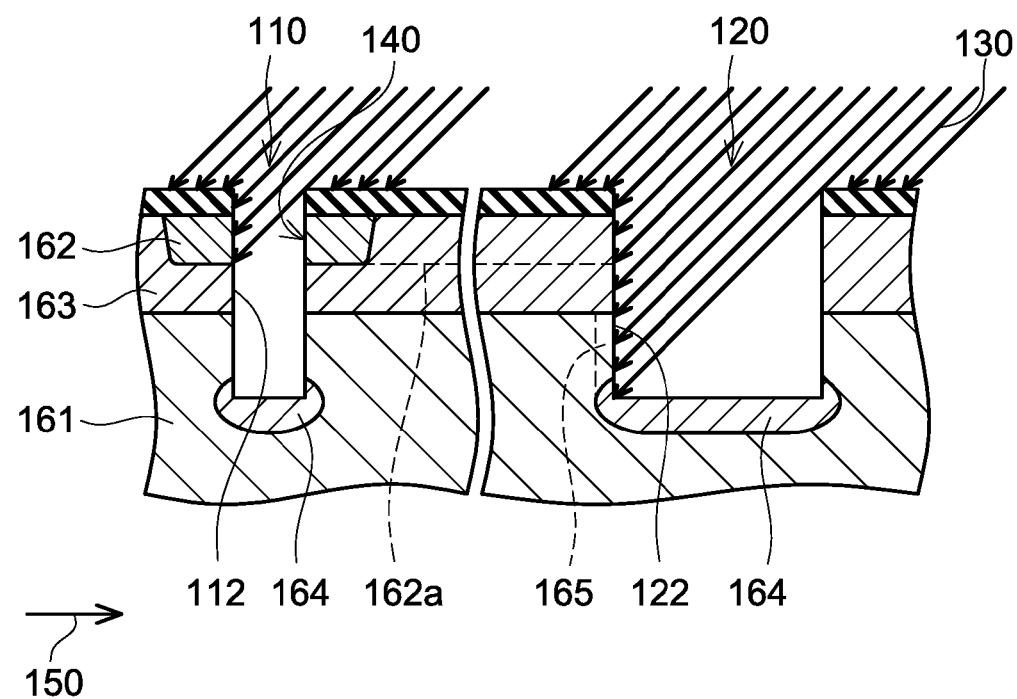
FIG. 16 is an explanatory view of an example of a manufacturing method disclosed herein.

Further, in the above-described embodiment, after the formation of the source regions 26 and the body contact regions 24a, the gate trenches 30 are formed. Alternatively, the source regions 26 and the body contact regions 24a may be formed after the formation of the gate electrodes 38. In this case, as shown in FIG. 15, at the time of carrying out the oblique implantation step, the source region 26 is not present. In this case, at the side surfaces 31a of the first portions 31, by making the p-type impurities be implanted to an upper side than a position of the lower ends of the source regions 26 that are to be formed afterward (position 56 in FIG. 15), the p-type impurities can be suppressed from being implanted to the region where the channel is formed.

Still further, in the above-described embodiment, the low-density body layer 24b is formed by the epitaxial growth. Alternatively, the low-density body layer 24b may be formed by ion implantation of the p-type impurities. In this case, the low-density body layer 24b may be formed after the formation of the gate electrodes 38.

Yet further, in the above-described embodiment, after carrying out the step of implanting the p-type impurities to the bottom regions 40, the oblique implantation step is carried out. Alternatively, those steps may be carried out in a reverse order.

Yet further, the MOSFET in the above-described embodiment is of an n-channel type. The technique disclosed in the present application may be applied also to other insulated gate type switching devices (such as MOSFET and IGBT of a p-channel type).

Now, description is made of relationships between the components in the above-described embodiment and components in Claims. The drift layer 22 in the embodiment is an example of "first semiconductor region" in Claims. The source region 26 in the embodiment is an example of "second semiconductor region" in Claims. The y-direction in the embodiment is an example of "first direction" in Claims. The axis parallel to the x-direction (inclined axis corresponding to the implantation direction in the oblique implantation step) in the embodiment is an example of "an axis orthogonal to the first direction on the surface" in Claims. The side surface 31a in the embodiment is an example of "first side surface" in Claims. The side surface 32a in the embodiment is an example of the "second side surface" in Claims.

Note that, in the above-described embodiment, it is preferred that, in the planar view of the semiconductor substrate, the connection regions be formed in a range where the second semiconductor region does not exist (for example, outside range). With this structure, the connection regions can be formed without reducing the number of current paths in the insulated gate type switching device.

Specific examples of the present invention has been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

What is claimed is:

1. A method for manufacturing an insulated gate type switching device, the method comprising:
    forming a laminated structure in a semiconductor substrate, the laminated structure including a first semiconductor region of a first conductivity type, a body region of a second conductivity type located on at least a part of the first semiconductor region, and a second semiconductor region of the first conductivity type located on at least a part of the body region;
    forming a gate trench including a first portion and a second portion, the first portion having a first width along a first direction in a planar view of a surface of the semiconductor substrate, the second portion having a second width along the first direction in the planar view of the surface, the second width being wider than the first width, the first portion penetrating the second semiconductor region and the body region from the surface to reach the first semiconductor region, and the second portion penetrating the body region from the surface to reach the first semiconductor region;
    forming a bottom region of the second conductivity type in a range exposed on a bottom surface of the gate trench;
    implanting second conductivity type impurities to a first side surface and a second side surface by irradiating the second conductivity type impurities, the first side surface being a side surface defining an end of the first portion in the first direction, the second side surface being a side surface defining an end of the second portion in the first direction, the irradiation being performed at an irradiating angle inclined with respect to a normal line of the surface around an axis orthogonal to the first direction on the surface, the first width, the second width, and the irradiating angle being set so that the second conductivity type impurities are suppressed from being implanted to a depth range located below a position of a lower end of the second semiconductor region at the first side surface and the second conductivity type impurities are implanted to the depth range located below the position of the lower end of the second semiconductor region at the second side surface, and a connection region of the second conductivity type connecting the body region and the bottom region being formed by the implantation of the second conductivity type impurities to the second side surface; and
    forming a gate electrode insulated from the semiconductor substrate by a gate insulating layer in the gate trench.

2. The method of claim 1, wherein the connection region is formed in a range in which the second semiconductor region does not exist in the planar view of the surface.

3. An insulated gate type switching device, comprising:
    a first semiconductor region of a first conductivity type;
    a body region of a second conductivity type located on at least a part of the first semiconductor region;
    a second semiconductor region of the first conductivity type located on at least a part of the body region;
    a gate trench including a first portion and a second portion, the first portion having a first width along a first direction in a planar view of a surface of a semiconductor substrate, the second portion having a second width along the first direction in the planar view of the surface, the second width. being wider than the first width, the first portion penetrating the second semiconductor region and the body region from the surface so as to reach the first semiconductor region, and the second portion penetrating the body region from the surface to reach the first semiconductor region;
    a bottom region of the second conductivity type located in a range exposed on a bottom surface of the gate trench;
    a connection region of the second conductivity type located in a range exposed on a side surface defining an end of the second portion in the first direction and connecting the body region and the bottom region; and a gate electrode located in the gate trench and insulated from the semiconductor substrate by a gate insulating layer, wherein a second conductivity type impurity density in the body region in a range exposed on a side surface defining an end of the first portion in the first direction is lower than a second conductivity type impurity density in the body region above the connection region and in the range exposed on the side surface defining the end of the second portion in the first direction.

* * * * *